United States Patent [19]

Takeuchi et al.

[11] Patent Number: 4,696,704

[45] Date of Patent: Sep. 29, 1987

[54] MATERIAL FOR LEAD FRAMES

[75] Inventors: Kazumasa Takeuchi, Aichi; Takaharu Iwadachi, Handa; Kazuo Ikushima, Nagoya, all of Japan

[73] Assignee: NGK Insulators, Ltd., Japan

[21] Appl. No.: 867,440

[22] Filed: May 28, 1986

[30] Foreign Application Priority Data

Jun. 13, 1985 [JP] Japan .................................. 60-129048

[51] Int. Cl.$^4$ .............................................. C22C 9/06
[52] U.S. Cl. ....................................  148/412; 148/413; 148/414; 148/433; 148/434; 148/435
[58] Field of Search ................ 420/485, 494; 148/412, 148/413, 414, 433, 434, 435

[56] References Cited

U.S. PATENT DOCUMENTS 4,599,120  7/1986  Church et al. ...................... 420/485

FOREIGN PATENT DOCUMENTS 10126  1/1976  Japan .

OTHER PUBLICATIONS

Chemical Abstracts, 85:50649u, "Mold Material for Continuous Casting of Steel", Mimura, R., Miyafuji, M., Matsunaga, M.

Primary Examiner—L. Dewayne Rutledge
Assistant Examiner—George Wyszomierski
Attorney, Agent, or Firm—Parkhurst & Oliff

[57] ABSTRACT

An excellent material for lead frames is provided which is economical and easily punched out to produce lead frames without bending or breakage, and has both superior tensile strength and high electrical conductivity, as well as splendid heat dissipation properties and good soldering properties.

16 Claims, 2 Drawing Figures

FIG._2
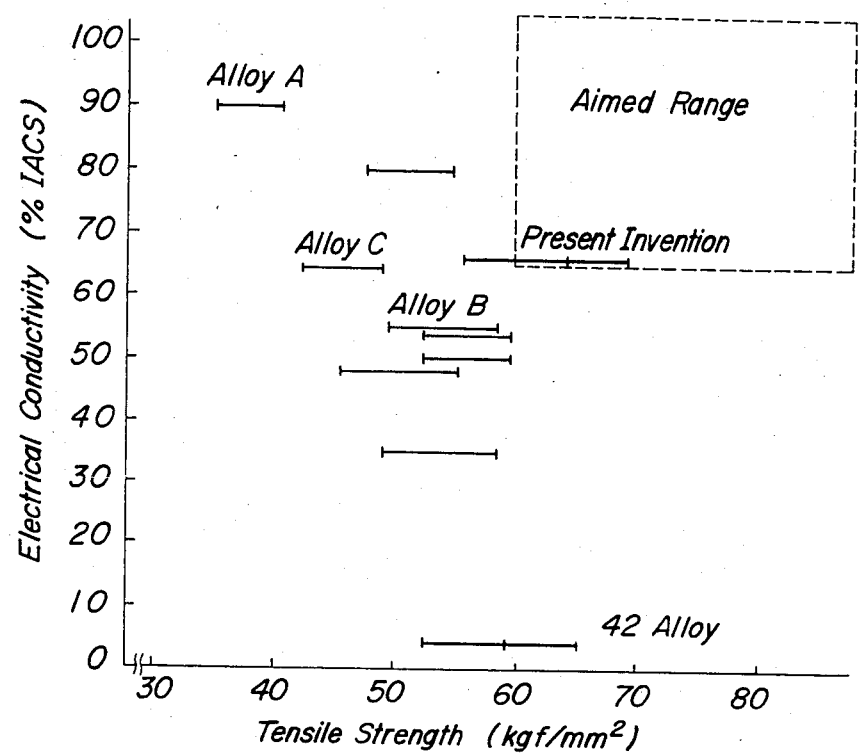

MATERIAL FOR LEAD FRAMES

BACKGROUND OF THE INVENTION

1. Field of the Invention

The present invention relates to a material for lead frames which can be used as lead frames for LSI and the like.

2. Related Art Statement

Usually, a lead frame has a general shape as depicted in FIG. 1. The lead frame is provided with a silicon chip attached on the central part 1 of the lead frame, and electrodes on the chip are connected to the leading part 2 of the lead frame through minute wires of Au or Al to accomplish the so-called "LSI". The LSI is mounted on a printed board for practical use. Such lead frame is produced usually from a thin plate material having a thickness of about 0.25 mm by punching it out from the material. Hence, a material for lead frames is required to have many characteristic properties such as sufficient mechanical strength to prevent breakage or bending of the thin legs 3 of the lead frame, high electrical conductivity, high thermal conductivity to rapidly dissipate heat generated in LSI chips, and good workability. A conventional material of for lead frames is the so-called 42 alloy having a composition consisting of 42% of Ni and the remainder being Fe, which has a tensile strength of 55-65 kgf/mm$_2$ as shown in FIG. 2, which, however, has the drawbacks of having a low electrical conductivity of 4% IACS, and insufficient heat dissipation resulting in thermal destruction when it is used as a lead frame for a highly integrated LSI, such as a 256 kb LSI.

Therefore, in order to improve electrical conductivity of a material to be used for a lead frame, there have been developed various types of copper alloys, such as A, B, C and the like, as illustrated in FIG. 2. Alloy A has a composition consisting by weight of 0.1% of Cr, 0.2% of Sn, and the remainder being Cu, and having an extremely high electrical conductivity of 90% IACS, but having a very poor tensile strength of about one-half that the 42 alloy. Alloy B has a composition consisting by weight of 2% of Sn, 0.2% of Fe, 0.03% of P, and the remainder being Cu, and having a high tensile strength of 50-60 kgf/mm$^2$ similar to that of the 42 alloy, but having a considerably low electrical conductivity of 35% IACS. Alloy C has a composition consisting by weight of 2.4% of Fe, 0.12% of Zn, 0.03% of P, and the remainder being Cu, and a fairly good electrical conductivity of 65% IACS, but having a very poor tensile strength of 40-47 kgf/mm$^2$. Thus, copper alloys show a tendency that when the electrical conductivity is decreased by having a content of an element other than copper, the strength is increased, while when the electrical conductivity is increased because copper is the primary element present, the strength is decreased. At present, a material has not been known which is economical to produce and satisfies both the requirements of superior strength and good electrical conductivity, simultaneously.

SUMMARY OF THE INVENTION

Therefore, an object of the present invention is to obviate the aforementioned drawbacks of the prior art.

Another object of the present invention is to provide a novel material for lead frames which has a tensile strength of 56 kgf/mm$^2$ or more, an electrical conductivity of 65% IACS or more, good workability, and superior soldering properties or welding properties, and which can be produced at a low cost.

A first aspect, of the present invention is to provide a thin plate material which is processed by age hardening after cold rolling, characterized in that it has a composition comprising by weight being 0.1-0.28% of Be, 0.5-1.3% of Ni, and the remainder being Cu and unavoidable impurities.

A second aspect of the present invention is to provide a thin plate material which is processed by age hardening after cold rolling, characterized in that it has a composition comprising by weight 0.1-0.28% of Be, 0.5-1.3% of Ni, at least one of 0.2% or less of Sn and 0.2% or less of Zn, and the remainder being Cu and unavoidable impurities.

The material for lead frames (to be referred to as "material", hereinafter) of the present invention is produced by melting a Cu alloy of either one of the above compositions to form a melt, casting the melt in a die to form an ingot, hot rolling the ingot, cold rolling the hot rolled ingot, solution heat treating the cold rolled ingot at a temperature of e.g. 750-860° C. for e.g. 5 minutes to form a solid solution of the alloy, cold rolling the solid soultion to an extent of 20-50% to from a thin plate of the alloy, and subjecting the thin plate to an age hardening step at a temperature of e.g. 350-500° C. for a time of e.g. 2 hours. The material has a superior tensile strength of 60 kgf/mm$^2$ or more due to the co-use of work hardening by the cold rolling after the solution heat treatment at 750-860° C. and precipitation hardening by the subsequent age hardening.

The Cu alloys containing 0.1-0.28% of Be and 0.5-1.3% of Ni used for the production of the material for lead frames in the present invention is a Cu alloy of the precipitation hardened type, wherein crystal grains of nickel berylide (NiBe) are uniformly distributed in the Cu matrix. For the maintaining the electrical conductivity of the material at a high level, respective amounts of the ingredients of the alloy should be adjusted such that all Ni crystal grains are precipitated out of the Cu matrix as NiBe and do not remain in the matrix. If the Be content is less than 0.1%, or if the Ni content is less than 0.5%, the material has poor hardening property and weak tensile strength. While, if the Be content exceeds 0.28%, or if the Ni content exceeds 1.3%, work hardening property and aging hardening property of the material are enhanced to improve the strength of the material, however, electrical conductivity of the material becomes less than 65% IACS because of the increase of the alloy ingredients. An especially good balance of electrical conductivity and tensile strength of the material can be obtained when the Be content is within a range of 0.14-0.20% and the Ni content is within a range of 0.5-0.95%.

The material according to the second aspect of the present invention has the same fundamental properties as the material of the first aspect of the present invention. It contains essentially at least one of 0.2% or less of Sn and 0.2% or less of Zn in addition to the alloy composition of the first aspect of the present invention, for the purpose of improving soldering properties of the material. If either of the Sn content and the Zn content exceeds 0.2%, the soldering property deteriorates and the electrical conductivity of the material suffers from an adverse influence.

Both alloys are preferably treated by solution heat treatment at a temperature of 750-860° C. If the temperature is less than 750° C., the improvement of the strength due to the age hardening is insufficient, while, if the temperature exceeds 860° C., crystal grains of the material become coarse so that the strength and the workability of the material is decreased.

BRIEF DESCRIPTION OF THE DRAWINGS

For a better understanding of the present invention, reference is made to the accompanying drawings, in which:

FIG. 2 is a characteristic graph of various materials for lead frames showing relationships between tensile strength and electrical conductivity of the materials using various alloys. In FIG. 1, referential numeral 1 is the central part, 2 is a leading part, and 3 is the thin legs, respectively of the lead frame.

In FIG. 2, the region encircled by a dotted line is the aimed range of the material of the present invention.

Figure 1:
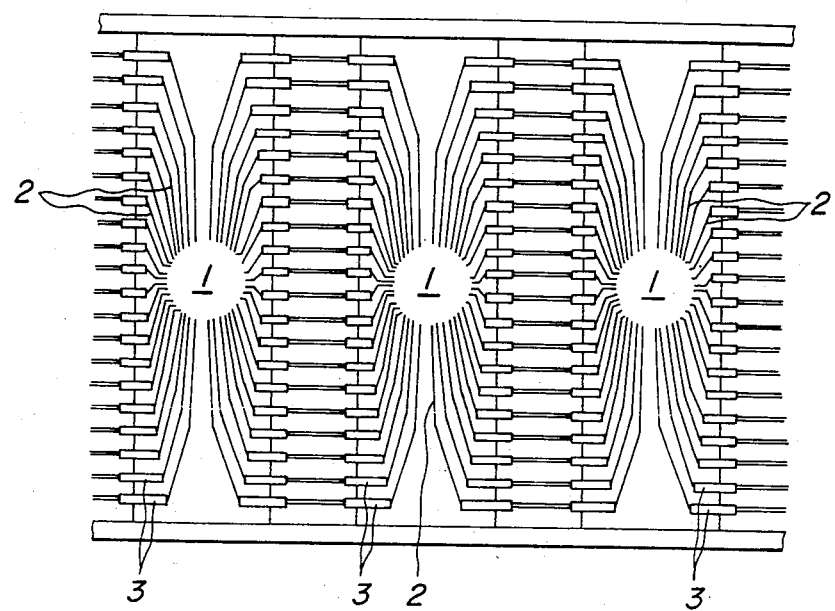
FIG. 1 is a plan view of a conventional lead frame.

ment at 350-500° C. for 2 hours to obtain the materials, namely, materials for lead frames. The materials, and materials produced from the aforementioned 42 alloy and a referential alloy C (a composition of 2.4% of Fe, 0.12% of Zn, 0.03% of P, and the remainder of Cu) produced in the same manner, were evaluated their according to their mechanical properties. The results are also shown in Table 1.

In Table 1, stress relaxation rate is derived by exerting a load of a maximum bending stress of 30 kgf/mm$^2$ on a test piece of the materials at 200° C. for 100 hours, removing the load from the test piece to measure the remaining stress, and calculating relaxed stress rates in terms of %. Bending formability is derived by a ratio R/t, dividing a minimum radius R that can bend a test piece most without forming a crack in the test piece by the thickness t of the thin plate. The soldering property is evaluated by a wettable time measured by a meniscograph.

TABLE 1 (a)

|  | Example | | | | | |
| --- | --- | --- | --- | --- | --- | --- |
|  | 1 | 2 | 3 | 4 | 5 | 6 |
| Alloy composition (wt %) | | | | | | |
| Be | 0.20 | 0.26 | 0.27 | 0.14 | 0.20 | 0.20 |
| Ni | 0.95 | 1.20 | 0.92 | 1.04 | 0.95 | 0.95 |
| Sn, Zn | — | — | — | — | 0.05 (Sn) | 0.02 (Zn) |
| Cu | remainder | remainder | remainder | remainder | remainder | remainder |
| Tensile strength (kgf/mm$^2$) | 59 | 66 | 62 | 56 | 58 | 59 |
| Elongation (%) | 10 | 10 | 10 | 12 | 10 | 10 |
| Electrical conductivity (% IACS) | 70 | 66 | 67 | 66 | 68 | 68 |
| Stress relaxation rate (%) | 20 | 15 | 20 | 20 | 20 | 20 |
| Bending formability (R/t) | 2 | 2 | 2 | 2 | 2 | 2 |
| Soldering property (sec.) | 1 | 1 | 1 | 1 | 0.5 | 0.5 |

TABLE 1 (b)

|  | Referential Example | | | | | |
| --- | --- | --- | --- | --- | --- | --- |
|  | 1 | 2 | 3 | 4 | 42 Alloy | Alloy C |
| Alloy composition (wt %) | | | | | | |
| Be | 0.24 | 0.30 | 0.10 | 0.04 | | |
| Ni | 1.56 | 1.74 | 0.21 | 1.20 | | |
| Sn, Zn | — | — | — | — | | |
| Cu | remainder | remainder | remainder | remainder | | |
| Tensile strength (kgf/mm$^2$) | 77 | 86 | 39 | 36 | 55–65 | 40–47 |
| Elongation (%) | 8 | 7 | 7 | 7 | 5–30 | ≧2 |
| Electrical conductivity (% IACS) | 54 | 59 | 77 | 54 | 4 | 65 |
| Stress relaxation rate (%) | 15 | 20 | 35 | 40 | — | 23 |
| Bending formability (R/t) | 2 | 3 | 2 | 2 | — | — |
| Soldering property (sec.) | 1 | 1 | 1 | 1 | — | 2.5 |

DESCRIPTION OF THE PREFERRED EMBODIMENTS

Hereinafter, the present invention will be explained in more detail with reference to examples, which, however, should not be construed as limitations of the present invention.

EXAMPLES 1-6 AND REFERENTIAL EXAMPLES 1-4

Alloys of the compositions as shown in the following Table 1 were respectively melted in a high frequency furnace, and cast molded in a die to form ingots. The ingots were hot rolled and cold rolled to form plates of ingots. Then, the plates were processed by a solution heat treatment at 750-860° C. for 5 minutes, and subsequently cold rolled to an extent of 20-50% to form thin plates having a thickness of about 0.25 mm. Thereafter, the thin plates were subjected to an age hardening treat- As clearly seen from the aforegoing descriptions, the material of the present invention exhibits superior tensile strength comparable to that of the material produced from the 42 alloy, as well as remarkably high electrical conductivity exceeding 65% IACS. Therefore, the material does not have the drawback of its legs being bent or broken when mounting it on a printed board, and can achieve a splendid heat dissipation effect even when used in a highly integrated LSI such as 256 kb LSI. Further, the material has a superior stress relaxation rate compared to the conventional material, and a good bending formability, so that it can be easily punched out to produce lead frames. In addition, the material has a noticeably good soldering property. Furthermore, the material contains the expensive Be in only a small amount, so that the material can be produced economically. Thus, the material of the present invention obviates the drawbacks of conventional materials, and contributes a great deal to the development of the industry.

Although the present invention has been explained with specific examples, it is of course apparent to those skilled in the art that various changes and modifications thereof are possible without departing the broad spirit and aspect of the present invention as defined in the appended claims.

What is claimed is:

1. A thin plate alloy for lead frames comprising 0.1–0.28% by weight of Be, 0.5–1.3% by weight of Ni, and a remainder being Cu and unavoidable impurities, said thin plate alloy having an electrical conductivity of at least 65% IACS, and a tensile strength of at least 56 kgf/mm$^2$.

2. The thin plate alloy of claim 1, wherein said alloy contains not more than 0.2% by weight of Sn.

3. The thin plate alloy of claim 1, wherein said alloy contains not more than 0.2% by weight of Zn.

4. The thin plate alloy of claim 1, wherein said alloy contains not more than 0.2% by weight of Sn and not more than 0.2% by weight of Zn.

5. A thin plate alloy for lead frames comprising 0.2–0.27% by weight of Be, 0.92–1.2% by weight of Ni, and a remainder being Cu and unavoidable impurities, said thin plate alloy having an electrical conductivity of at least 66% IACS, and a tensile strength of at least 58 kgf/mm$^2$.

6. The thin plate alloy of claim 5, wherein said alloy contains not more than 0.2% by weight of Sn.

7. The thin plate alloy of claim 5, wherein said alloy contains not more than 0.2% by weight of Zn.

8. The thin plate alloy of claim 5, wherein said alloy contains not more than 0.2% by weight of Sn and not more than 0.2% by weight of Zn.

9. A thin plate alloy for lead frames comprising 0.1–0.28% by weight of Be, 0.5–1.3% by weight of Ni, and a remainder being Cu and unavoidable impurities, said alloy being produced by solution heat treating the alloy at a temperature of 750–860° C., rolling said alloy to an extent of 20–50% and age hardening said alloy at a temperature of 350–500° C., to result in said alloy having an electrical conductivity of at least 65% IACS, and tensile strength of at least 56 kgf/mm$^2$.

10. The thin plate alloy of claim 9, wherein said alloy contains not more than 0.2% by weight of Sn.

11. The thin plate alloy of claim 9, wherein said alloy contains not more than 0.2% by weight of Zn.

12. The thin plate alloy of claim 9, wherein said alloy contains not more than 0.2% by weight of Sn and not more than 0.2% by weight of Zn.

13. The thin plate alloy of claim 9, wherein Be is present in an amount 0.2–0.27% by weight, Ni is present in an amount 0.92–1.2% by weight, the electrical conductivity is at least 66% IACS and the tensile strength is at least 58 kgf/mm$^2$.

14. The thin plate alloy of claim 13, wherein said alloy contains not more than 0.2% by weight of Sn.

15. The thin plate alloy of claim 13, wherein said alloy contains not more than 0.2% weight of Zn.

16. The thin plate alloy of claim 13, wherein said alloy contains not more than 0.2% by weight of Sn and not more than 0.2% by weight of Zn.

* * * * *